United States Patent [19]
Delagrange

[11] Patent Number: 4,767,998
[45] Date of Patent: Aug. 30, 1988

[54] ACTIVE FILTER USING LOW GAIN AMPLIFICATION STAGES

[75] Inventor: Arthur D. Delagrange, Mt. Airy, Md.

[73] Assignee: The United States of America as represented by the Secretary of the Navy, Washington, D.C.

[21] Appl. No.: 16,694

[22] Filed: Feb. 19, 1987

[51] Int. Cl.[4] .............................................. H03F 1/34
[52] U.S. Cl. .................................. 330/107; 330/109; 330/294
[58] Field of Search .................... 330/107, 109, 294

[56] References Cited
U.S. PATENT DOCUMENTS
3,577,179 5/1971 West .................................... 330/107

Primary Examiner—James B. Mullins
Attorney, Agent, or Firm—Kenneth E. Walden; Frederick A. Wein

[57] ABSTRACT

A high frequency active filter is presented having an amplifier having an open loop gain between one and three which is provided with appropriate electrical components of appropriate values for generating the desired filter configuration of pole-zero pairs with no intentional connection between the negative input terminal of the amplifier and the output terminal of the amplifier.

7 Claims, 2 Drawing Sheets

ACTIVE FILTER USING LOW GAIN AMPLIFICATION STAGES

BACKGROUND OF THE INVENTION

The present invention relates to active filters, and more particularly, to active filters at high frequencies using low gain amplification stages.

In order to appreciate the present invention of high frequency active filters, a comparison between active and passive filters is pertinent. Passive filters were the forerunners of active filters, and much of the basic theory carried over. (Crystal and mechanical filters can be reasonably classified with passive filters.) Digital filters are the next step beyond analog active filters, although a direct comparison is not completely fair inasmuch as a digital filter usually requires an analog prefilter and post filter.

The requirement of a power supply for active filters is no longer a significant handicap although active filters do require better regulation while digital filters usually require more power. Passive filters have virtually no high-frequency limit, but become bulky below 10 KHz and are virtually unacceptable below 1 KHz. Active filters suit the mid-range from 1 Hz to 1 KHz, but can be used with some care to 10 KHz and in limited applications can be used as high as 100 KHz. Passive filters usually must be impedance-matched on both input and output while active filters normally have a high enough input impedance and a low enough output impedance that impedance is not a problem. Some types of passive filters can have many sections, e.g., 23-pole crystal filters are common. Active filter design becomes difficult beyond 10 poles. Similarly, with dynamic range, passive filters have no inherent limit beyond practical considerations such as the size of inductances on the low end and parasitic capacitance or load and other inductances at the high end. Active filters are limited by power supply on the high end and semiconductor noise on the low end. Additionally, passive filters are expensive and bulky primarily because of inductors. Passive filters often show large discrepancies between calculated and actual performance, while active filters calculations tend to be good, especially if tolerance errors are accounted for.

A filter is usually specified as an amplitude response versus frequency curve. For example, an ideal low-pass filter would have rectangular characteristics with the passband perfectly flat, the transition band being infinitely steep, and the reject band having complete rejection everywhere. However, such a filter cannot be built, at least not with a finite number of parts. A more realistic filter is to add a finite slope. However, it turns out that this is still unrealizable because the corner is infinitely sharp. If the corner is rounded, the characteristic may be achievable. Additionally, the filter is not completely specified without adding phase response which often is ignored. Therefore, filter transfer functions are usually specified by polynominals, or more precisely by a ratio of polynominals, such as:

$$H(S) = K \frac{S + 2}{S^3 + 3S^2 + 4S + 2}$$

Each term after the first in either the numerator or the denominator creates one bend in the amplitude response curve, which also corresponds to one reactive component in a circuit. Thus a ratio of finite polynominals implies a finite number of components.

To change a low-pass function to a high-pass function, S is replaced by 1/S everywhere in the polynominal. It can be shown that the new prototype circuit may be obtained by replacing each capacitor with an inductor (and vice-versa if necessary). This is not directly applicable herein because one of the reasons for using active filters in the first place was to avoid inductors. Further transformations may or may not be possible to eliminate the inductors. Alternately, in some circuits the resistors and capacitors may be simply interchanged. The component values are inverted because the impedance of a capacitor is inversely proportional to its value.

Likewise, a low-pass may be transformed to a bandpass by replacing S by S+1/S in the polynominal, which replaces each capacitor with a capacitor in parallel with an inductor.

Previous designs, except for the simplest functions, used op-amps. Op-amps (operational amplifiers) must have very high (virtually infinite) gain, but yet be stable with the output connected directly to the (inverting) input (negative feedback). This is a difficult requirement and thus, op-amps have stability problems and do not work well at high frequency.

Accordingly, it is desirable to provide a simple, concise, unified method for building any type of high frequency active filter without using unstable, very high gain op-amps.

Accordingly, it is an object of the present invention to provide high frequency active filters which are stable at said high frequencies without the use of high gain op-amp's.

Further objects and advantages of the present invention will become apparent as the following description proceeds and features of novelty characterizing the invention will be pointed out with particularity in the claims annexed to and forming a part of this specification.

SUMMARY OF THE INVENTION

Briefly, the present invention provides high frequency active filters which are stable at said high frequencies without the use of high gain op-amps that are inherently unstable at such frequencies. Accordingly, the present invention permits the raising of the high frequency limit normally imposed on the use of active filters.

An amplifier having an open loop gain between one and three is provided with appropriate electrical components of appropriate values for generating the desired filter configuration of pole-zero pairs with no intentional connection between the negative input terminal of the amplifier and the output terminal of the amplifier.

DESCRIPTION OF THE DRAWINGS

For a better understanding of the present invention reference may be had to the accompanying drawings wherein.

back. The transfer function for this general circuit is shown in Eq. 1.

TABLE 1

| CIRCUIT FUNCTIONS REQUIRING ZEROS | | | | | | |
|---|---|---|---|---|---|---|
| FILTER FUNCTION | FORMULA | $\delta$ | G | $R_1$ | $R_2$ | $R_3$ |
| Pole-zero quad; low-pass with imag. zeros | $\dfrac{S^2 + D}{S^2 + AS + B}$; $D > B$ | $1 - \dfrac{1}{2 + \dfrac{B}{D}}$ | $3 - \dfrac{A}{\sqrt{B}}$ | 1 | 1 | None |
| Pole-zeros quad; high-pass with imag. zeros | $\dfrac{S^2 + D}{S^2 + AS + B}$; $D < B$ | $1 - \dfrac{1}{2 + \dfrac{D}{B}}$ | $3 - \dfrac{A}{\sqrt{B}}$ | $\dfrac{1}{\sqrt{B}}$ | $\dfrac{1}{\sqrt{B}}$ | $\dfrac{1}{\sqrt{B}} \cdot \dfrac{1}{\dfrac{3}{2 + \dfrac{D}{B}} - 1}$ |
| | | | | $2 - \dfrac{3}{2 + \dfrac{D}{B}}$ | | |
| Pole-zero quad; notch | $\dfrac{S^2 + B}{S^2 + AS + B}$ | $\dfrac{2}{3}$ | $3 - \dfrac{A}{\sqrt{B}}$ | $\dfrac{1}{\sqrt{B}}$ | $\dfrac{1}{\sqrt{B}}$ | None |
| Pole-zero quad; all-pass | $\dfrac{S^2 - AS + B}{S^2 + AS + B}$ | $1 - \dfrac{1}{3 + \dfrac{A}{\sqrt{B}}}$ | $3 - \dfrac{A}{\sqrt{B}}$ | $\dfrac{1}{\sqrt{B}}$ | $\dfrac{1}{\sqrt{B}}$ | None |
| Pole-zero single zero; bandpass | $\dfrac{S}{S^2 + AS + B}$ | 1 | $3 - \dfrac{A}{\sqrt{B}}$ | $\dfrac{1}{\sqrt{B}}$ | $\dfrac{1}{\sqrt{B}}$ | None |
| Pole-zero pair; all-pass | $\dfrac{S - 1}{S + 1}$ | $\dfrac{1}{2}$ | Doesn't Matter | 1 | None | None |
| FILTER FUNCTION | FORMULA | $C_1$ | | $C_2$ | $C_3$ | |
| Pole-zero quad; low-pass with imag. zeros | $\dfrac{S^2 + D}{S^2 + AS + B}$; $D > B$ | $\dfrac{1}{\sqrt{B}}\left(2 - \dfrac{3}{2 + \dfrac{B}{D}}\right)$ | | $\dfrac{1}{\sqrt{B}}$ | $\dfrac{1}{\sqrt{B}}\left(\dfrac{3}{2 + \dfrac{D}{B}} - 1\right)$ | |
| Pole-zeros quad; high-pass with imag. zeros | $\dfrac{S^2 + D}{S^2 + AS + B}$; $D < B$ | 1 | | 1 | None | |
| Pole-zero quad; notch | $\dfrac{S^2 + B}{S^2 + AS + B}$ | 1 | | 1 | None | |
| Pole-zero quad; all-pass | $\dfrac{S^2 - AS + B}{S^2 + AS + B}$ | 1 | | 1 | None | |
| Pole-zero single zero; bandpass | $\dfrac{S}{S^2 + AS + B}$ | 1 | | 1 | None | |
| Pole-zero pair; all-pass | $\dfrac{S - 1}{S + 1}$ | None | | None | 1 | |

DETAILED DESCRIPTION OF THE PREFERRED EMBODIMENT

Building active filters without op-amps can virtually eliminate stability problems and provide much larger bandwidths. The op-amp's high gain and its requirement for stability with negative feedback are contradictory especially at high frequencies. However, as shown herein, one can build any active filter without negative feedback, using an amplifier with a fixed gain no higher than 3. It should be noted that this amplifier will also have a low output impedance and true diffferential high-impedance inputs.

Figure 1A:
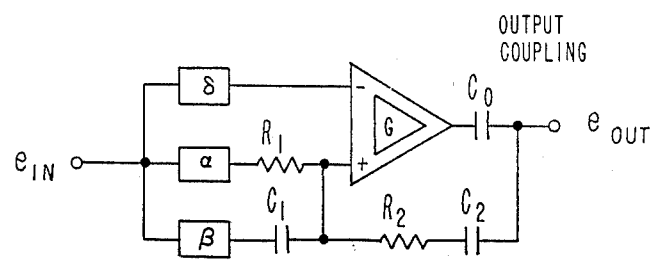
FIG. 1 shows a general schematic of an exemplary embodiment of the present invention for generating pole-zero pairs.

Noninverting Sallen-Key lowpass and highpass filters use the op-amp only as a fixed-gain amplifier. For other functions, the circuit shown in FIG. 1a allows one to generate pole-zero pairs using a fixed-gain amplifier (represented by a double triangle). The $\alpha$, $\beta$, $\delta$ and components are voltage dividers; two of them will make use of the input resistor and capacitor shown. Note should be made of the absence of negative feedback. The transfer function for this general circuit is shown in Eq. 1.

EQUATION $$\dfrac{e\,\text{out}}{e\,\text{in}} = G\dfrac{S^2 + \dfrac{[(\beta-\delta)R_1C_1+(\alpha-\delta)R_2C_2-\delta R_1C_2]}{(\beta-\delta)R_1R_2C_1C_2}S + \dfrac{(\alpha-\delta)}{(\beta-\delta)R_1R_2C_1C_2}}{S^2 + \dfrac{[R_1C_1+R_2C_2+(1-G)R_1C_2]}{R_1R_2C_1C_2}S + \dfrac{1}{R_1R_2C_1C_2}}$$

Figure 1B:
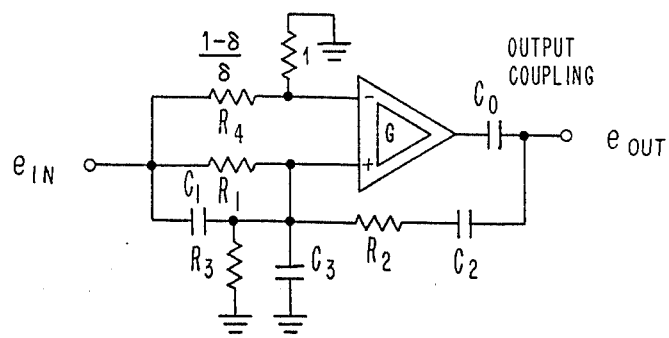

The complete single circuit, including the voltage-divider components, is shown in FIG. 1b. These components assume values as shown in Table 1 for different filter functions; note that the circuit is simplified for a specific application. Functions with arbitrary zeros are not listed because of the complexity of their realization and because they are not used in common filter types. Table 1 shows normalized component relations for various filter configurations with the normalized component values correlated with FIGS. 1 and 2. Other such filter configurations include elliptic, Butterworth, Bessel, and Chebyschev filter configurations.

EXAMPLE

Figure 3:
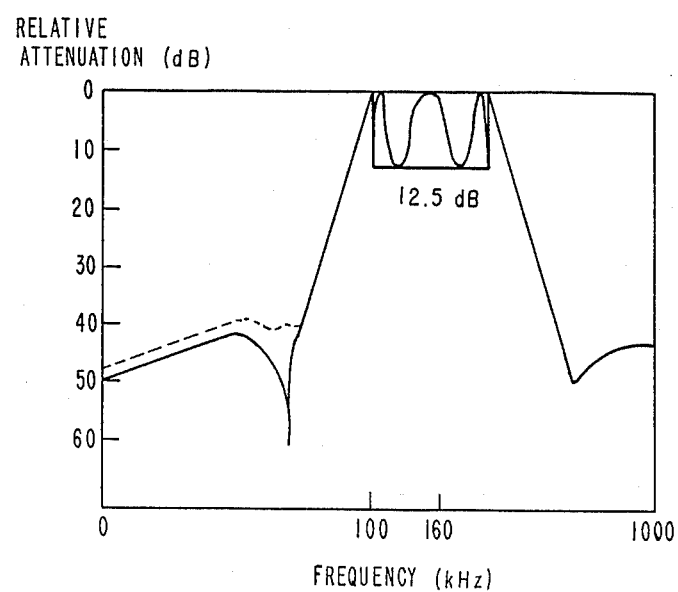
FIG. 3 is a graph showing the frequency response of the bandpass filter of FIG. 2 having a high center frequency of 160 KHz and without the respective amplifiers being provided with negative feedback.
Figure 2:
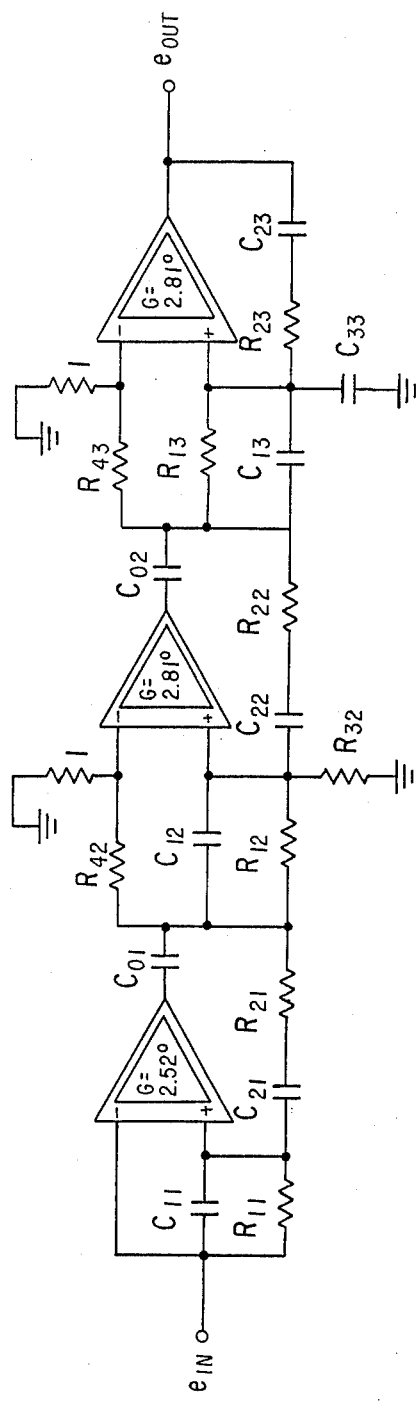
FIG. 2 shows a plurality of amplifiers shown in FIG. 1 connected for providing a filter configuration, and in particular, a bandpass filter.

For example, Texas Instruments TL 592 video amps can be used. The circuit of FIG. 2 shows a multi-stage filter with a raising of the impedance level to 1K and raising the center frequency to $10^6$ radians/sec (160 KHz), quite high for active filters. Components were selected to ±1%. The designations of the components of FIG. 2 correlate with the designations of FIG. 1 and Table 1 e.g., $R_1$ correlates to $R_{11}$, $R_{12}$, $R_{13}$ with the second numeral of the subscript correlating to the stage of the filter. The double triangle shows a fixed gain amplifier. A performance graph of this circuit is shown in FIG. 3. At the lower frequency end, the dotted line indicates readings taken with a true-RMS meter and is higher due to harmonics from the oscillator and/or amp distortion. This low frequency part of the curve was corrected using a spectrum analyzer. Performance at room temperature is quite good. However, temperature stability of the TL 592 is not specified and for use over a wide temperature range, a temperature stable device is desirable.

In addition to the values given in Table 1, poles and zeros for elliptic low-pass filters are given in Zverev, A, Handbook of Filter Synthesis, Wiley & Sons, New York, NY, 1967 where transformation to high-pass is also given, and said values are incorporated by reference herein.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent is:

1. A high frequency active filter comprising:
    an amplifier having an open loop gain consisting of between one and three, said amplifier having a positive input terminal, a negative input terminal, and an output terminal, the impedance between the negative input terminal and the output terminal being infinite, and
    means connected to said terminals for frequency filtering signals inputted at the input terminals and outputted at the output terminal,
    said filter being configured according to the transfer function as follows:

$$\frac{e_{out}}{e_{in}} = G \frac{S^2 + \frac{[(\beta-\delta)R_1C_1 + (\alpha-\delta)R_2C_2 - \delta R_1C_2]}{(\beta-\delta)R_1R_2C_1C_2} S + \frac{(\alpha-\delta)}{(\beta-\delta)R_1R_2C_1C_2}}{S^2 + \frac{[R_1C_1 + R_2C_2 + (1-G)R_1C_2]}{R_1R_2C_1C_2} S + \frac{1}{R_1R_2C_1C_2}}$$

wherein:
    amplifier circuit input $e_{in}$ and amplifier circuit output $e_{out}$ are terminals of an amplifier circuit which comprises the amplifier,
    $\alpha$ is an attenuator connected between the circuit input $e_{in}$ and, through resistor $R_1$, to the positive input terminal of the amplifier,
    $\beta$ is an attenuator connected between the circuit input $e_{in}$ and through capacitor $C_1$, to the positive input terminal of the amplifier,
    $\delta$ is an attenuator connected between the circuit input $e_{in}$ and the negative input terminal of the amplifier,
    $R_2$ and $C_2$ comprise feedback from the circuit output $e_{out}$ to the positive input terminal of the amplifier, and
    G is the open loop gain of the amplifier.

2. The active filter of claim 1 wherein the means connected to said terminals comprises reactive components.

3. The active filter of claim 2 wherein said reactive members comprise capactive components.

4. The active filter of claim 1 wherein the means connected to said terminals comprises component means configured for providing a desired filter configuration.

5. The active filter of claim 4 wherein said configured component means generate desired pole-zero pairs of said desired filter configuration.

6. A high frequency active filter comprising:
    an amplifier having an open loop gain consisting of between one and three, said amplifier having a positive input terminal, a negative input terminal, and an output terminal, the impedance between the negative input terminal and the output terminal being infinite,
    first means connected to the negative input terminal,
    second means connected to the positive input terminal,
    third means connected to the output terminal, and
    said first, second and third means configured for providing a desired filter configuration,
    said filter being configured according to the transfer function as follows:

$$\frac{e_{out}}{e_{in}} = G \frac{S^2 + \frac{[(\beta-\delta)R_1C_1 + (\alpha-\delta)R_2C_2 - \delta R_1C_2]}{(\beta-\delta)R_1R_2C_1C_2} S + \frac{(\alpha-\delta)}{(\beta-\delta)R_1R_2C_1C_2}}{S^2 + \frac{[R_1C_1 + R_2C_2 + (1-G)R_1C_2]}{R_1R_2C_1C_2} S + \frac{1}{R_1R_2C_1C_2}}$$

wherein:
    amplifier circuit input $e_{in}$ and amplifier circuit output $e_{out}$ are terminals of an amplifier circuit which comprises the amplifier,
    $\alpha$ is an attenuator connected between the circuit input $e_{in}$ and, through resistor $R_1$, to the positive input terminal of the amplifier,
    $\beta$ is an attenuator connected between the circuit input $e_{in}$ and through capacitor $C_1$, to the positive input terminal of the amplifier,
    $\delta$ is an attenuator connected between the circuit input $e_{in}$ and the negative input terminal of the amplifier,
    $R_2$ and $C_2$ comprise feedback from the circuit output $e_{out}$ to the positive input terminal of the amplifier, and
    G is the open loop gain of the amplifier.

7. A high frequency active filter comprising of:

an amplifier having an open loop gain between one and three, said amplifier having a positive input terminal, a negative input terminal, and an output terminal, the impedance between the negative input terminal and the output terminal being infinite, and means connected to said terminals configured for providing desired filter configurations, said filter being configured according to the transfer function as follows:

$$\frac{e_{out}}{e_{in}} = G \frac{S^2 + \frac{[(\beta-\delta)R_1C_1+(\alpha-\delta)R_2C_2-\delta R_1C_2]}{(\beta-\delta)R_1R_2C_1C_2} S + \frac{(\alpha-\delta)}{(\beta-\delta)R_1R_2C_1C_2}}{S^2 + \frac{[R_1C_1+R_2C_2+(1-G)R_1C_2]}{R_1R_2C_1C_2} S + \frac{1}{R_1R_2C_1C_2}}$$

wherein:

amplifier circuit input $e_{in}$ and amplifier circuit output $e_{out}$ are terminals of an amplifier circuit which comprises the amplifier, $\alpha$ is an attenuator connected between the circuit input $e_{in}$ and, through resistor $R_1$, to the positive input terminal of the amplifier, $\beta$ is an attenuator connected between the circuit input $e_{in}$ and through capacitor $C_1$, to the positive input terminal of the amplifier, $\delta$ is an attenuator connected between the circuit input $e_{in}$ and the negative input terminal of the amplifier, $R_2$ and $C_2$ comprise feedback from the circuit output $e_{out}$ to the positive input terminal of the amplifier, and G is the open loop gain of the amplifier.

* * * * *